(12) United States Patent
Tuncer

(10) Patent No.: US 12,066,379 B2
(45) Date of Patent: Aug. 20, 2024

(54) SENSING APPARATUS AND METHOD OF OPERATION THEREOF

(71) Applicant: CAMBRIDGE BATTERY RESEARCH LIMITED, Cambridge (GB)

(72) Inventor: Hatice Munevver Tuncer, Cambridge (GB)

(73) Assignee: CAMBRIDGE BATTERY RESEARCH LIMITED, Cambridge (GB)

( * ) Notice: Subject to any disclaimer, the term of this patent is extended or adjusted under 35 U.S.C. 154(b) by 257 days.

(21) Appl. No.: 17/641,382

(22) PCT Filed: Sep. 11, 2020

(86) PCT No.: PCT/IB2020/058460
§ 371 (c)(1),
(2) Date: Mar. 8, 2022

(87) PCT Pub. No.: WO2021/048807
PCT Pub. Date: Mar. 18, 2021

(65) Prior Publication Data
US 2022/0341845 A1  Oct. 27, 2022

(30) Foreign Application Priority Data
Sep. 13, 2019 (GB) .................... 1913227

(51) Int. Cl.
*G01N 21/3581* (2014.01)
*G01R 31/308* (2006.01)
*H01M 10/42* (2006.01)

(52) U.S. Cl.
CPC ....... *G01N 21/3581* (2013.01); *G01R 31/308* (2013.01); *H01M 10/4285* (2013.01)

(58) Field of Classification Search
CPC ............. G01N 21/3581; G01R 31/308; H01M 10/4285
See application file for complete search history.

(56) References Cited

U.S. PATENT DOCUMENTS

| | | | |
|---|---|---|---|
| 2004/0099526 A1 | 5/2004 | Ito et al. | |
| 2013/0320216 A1* | 12/2013 | Aiko | ...................... G01N 21/88 250/353 |

(Continued)

FOREIGN PATENT DOCUMENTS

| | | | |
|---|---|---|---|
| WO | 2017051579 A1 | 3/2017 | |
| WO | WO-2017051579 A1 * | 3/2017 | ............. G01B 11/06 |

OTHER PUBLICATIONS

Akiwa et al, "Evaluation of Li-ion battery using a Terahertz Chemical Microscope" 43rd International Conference on Infrared, Millimeter, and Terahertz Waves (IRMMW-THz), Available from: https://ieeexplore.ieee.org/stamp/stamp.jsp?tp=&arnum [Accessed Mar. 11, 2020], Oct. 29, 2018, 2 pages.

(Continued)

*Primary Examiner* — Blake C Riddick
(74) *Attorney, Agent, or Firm* — Ziegler IP Law Group, LLC.

(57) ABSTRACT

A sensing apparatus that senses structure of electrode of electrical battery. The electrode is arranged to have layers spatially adjacent thereto that provide a waveguide region that includes a surface of the electrode that changes in structure. The sensing apparatus includes a source of Terahertz electromagnetic radiation, and a coupling arrangement that couples Terahertz electromagnetic radiation from the source into the waveguide region. The Terahertz electromagnetic radiation interacts with features present at the surface. The sensing apparatus includes detector that receives Terahertz electromagnetic radiation that is reflected and/or transmitted through the waveguide region, and pro- (Continued)

cesses the Terahertz electromagnetic radiation to determine temporal changes therein that are indicative of dendritic growths occurring at the surface of the electrode or any manufacturing or structural faults.

16 Claims, 4 Drawing Sheets

(56) References Cited

U.S. PATENT DOCUMENTS

| | | | | |
|---|---|---|---|---|
| 2014/0092375 A1* | 4/2014 | Raghavan | ............... | G01L 1/246 |
| | | | | 356/32 |
| 2014/0203783 A1* | 7/2014 | Kiesel | ................... | H01M 10/44 |
| | | | | 320/167 |
| 2015/0155605 A1* | 6/2015 | Dvorsky | ............... | H01M 10/48 |
| | | | | 324/426 |
| 2015/0270584 A1* | 9/2015 | Saunders | ............ | H01M 50/457 |
| | | | | 324/426 |
| 2015/0280290 A1* | 10/2015 | Saha | ................. | H01M 10/4257 |
| | | | | 324/426 |
| 2015/0303723 A1* | 10/2015 | Raghavan | .......... | G01N 21/7703 |
| | | | | 73/19.01 |
| 2016/0013522 A1* | 1/2016 | Morrow | ............... | G01M 11/086 |
| | | | | 324/426 |
| 2016/0240897 A1* | 8/2016 | Saunders | ............... | G01N 21/59 |
| 2017/0082694 A1* | 3/2017 | Yonemoto | ........... | H01M 10/486 |
| 2018/0241080 A1* | 8/2018 | Jena | ................... | H01M 10/0525 |
| 2023/0375631 A1* | 11/2023 | Roumi | ................. | G01R 31/385 |

OTHER PUBLICATIONS

Cate et al. "Origin of Low Sensitizing Efficiency of Quantum Dots in Organic Solar Cells" in ACS Nano[online], Available from https://pubs.acs.org/doi/pdf/10.1021/nn303058u [Accessed Mar. 11, 2020, vol. 6, No. 10, pp. 8983-8988, Sep. 5, 2012, 6 pages.

Intellectual Property Office, Combined Search and Examination Report under Sections 17 and 18(3), Application No. GB1913227.3, Mailed Mar. 12, 2020, 7 pages.

Notification of Transmittal of The International Preliminary Report on Patentability, Application No. PCT/IB2020/058460, Mailed Aug. 26, 2021, 24 pages.

Notification of Transmittal of The International Search Report and The Written Opinion of The International Searching authority, or The Declaration, Application No. PCT/IB2020/058460, Mailed Dec. 11, 2020, 11 pages.

Peng et al, "Terahertz modulator based on graphene-embedded waveguide" 15th International Conference on Optical Communications and Networks (ICOCN), XP033075219, DOI 10.1109/ICOCN.2016.7875776, Sep. 24-27, 2016, 3 pages.

Written Opinion of The International Preliminary Examining Authority, Application No. PCT/IB2020/058460, Mailed Jun. 7, 2021, 8 pages.

* cited by examiner

SENSING APPARATUS AND METHOD OF OPERATION THEREOF

TECHNICAL FIELD

The present disclosure relates generally to battery management systems; and more specifically, to sensing apparatuses that sense structure of battery. Moreover, the present disclosure relates to methods for sensing structure of battery.

BACKGROUND

Over the years, electrical batteries have increasingly been deployed to make power supply smoother and predictable, owing to an intermittent supply and demand of electrical energy. Moreover, the electrical batteries enable storage and retrieval of electrical energy for the rapidly advancing technology of the smart grid and electric vehicles (EVs), and also for remote locations lacking a grid-connected infrastructure, in a clean, safe, reliable and affordable manner. Typically, an electrical battery consists of two or more electrochemical cells that convert stored chemical energy into electrical energy.

However, an electrical battery requires a battery management system (BMS) for a safe, reliable and efficient operation thereof. Specifically, the battery management system prevents operation of the electrical battery in unsafe operating environment. Moreover, the battery management system monitors state of the electrical battery by analysing data relating to operating conditions (for example, voltage of operation, current of operation, temperature of operation, flow of coolants, and so forth) and estimating state-of-charge (SoC), state-of-health (SoH), state-of-life (SoL), total useful capacity, deliverable power or state-of-power (SoP), and the likes. Additionally, the battery management system operates to control the operating conditions of the electrical battery so as to prevent degradation of the electrical battery in case of hazardous operating conditions, by incorporating battery safety and protection, charge control, cell balancing and thermal management functionalities.

However, such battery management system fails to monitor degradation level of the electrical battery. Typically, the battery management system monitors health of the electrical battery based on external characteristics (for example, heat dissipated, external breakage, and the likes) of the electrical battery, wherein the external characteristics are affected by operational conditions of the electrical battery (for example, temperature, pressure, and humidity of environment of operation, supply voltage, supply current, and nature of load connected to the electrical battery). However, the aforesaid battery management system do not monitor any changes in the internal state of the electrical battery due to manufacturing or structural faults, physical and chemical changes that occur naturally over time, or operating parameters that change due to charging strategy (e.g. deep charging, overcharging, fast charging and so on). Subsequently, the battery management system fails to identify internal abnormalities associated with the electrical battery. Consequently, such lack of information regarding internal abnormalities in the electrical battery results in hazardous outcomes such as short circuit, leakage, exothermic reaction, thermal runaway, multiple cell failure, venting, rupture, and explosion, and so forth. Additionally, such occurrence of hazardous events affects performance and efficiency of the electrical battery, presents challenges to emergency response teams and further leads to a state of disruption and turmoil amongst people owing to safety risks associated therewith.

Therefore, in light of the foregoing discussion, there exists a need to overcome the aforementioned drawbacks associated with the conventional battery management systems for monitoring the health of electrical batteries during their entire lifetime of operation.

SUMMARY

The present disclosure seeks to provide a sensing apparatus that senses a structure of an electrode of an electrical battery. The present disclosure also seeks to provide a method for sensing a structure of an electrode of an electrical battery. The present disclosure seeks to provide a solution to the existing problem associated with conventional battery management systems that analyse only operational conditions of electrical battery to monitor health thereof. An aim of the present disclosure is to provide a solution that overcomes at least partially the problems encountered in prior art, and provides a sensing apparatus that senses structure of electrode of electrical battery to monitor health thereof.

In one aspect, an embodiment of the present disclosure provides a sensing apparatus that senses, when in operation, a structure of an electrode of an electrical battery, wherein the electrode is arranged to have one or more layers spatially adjacent to form a waveguide region that includes a surface of the electrode that changes in structure as a state-of-charge of the electrical battery changes, wherein the sensing apparatus includes:

(i) a source of Terahertz electromagnetic radiation, and a coupling arrangement that couples Terahertz electromagnetic radiation from the source into the waveguide region, whereat the Terahertz electromagnetic radiation interacts with one or more features present at the surface of the electrode; and (ii) a detector that receives Terahertz electromagnetic radiation that is reflected and/or transmitted through the waveguide region, and processes the Terahertz electromagnetic radiation that is reflected and/or transmitted to determine temporal changes therein that are indicative of one or more dendritic growths occurring at the surface of the electrode.

In another aspect, an embodiment of the present disclosure provides a method of (for) sensing a structure of an electrode of an electrical battery, wherein the electrode is arranged to have one or more layers spatially adjacent to form a waveguide region that includes a surface of the electrode that changes in structure as a state-of-charge of the electrical battery changes, wherein the method includes:

(i) using a sensing apparatus including a source of Terahertz electromagnetic radiation, and a coupling arrangement to couple Terahertz electromagnetic radiation from the source into the waveguide region, whereat the Terahertz electromagnetic radiation interacts with one or more features present at the surface of the electrode; and (ii) using a detector to receive Terahertz electromagnetic radiation that is reflected and/or transmitted through the waveguide region, and to process the Terahertz electromagnetic radiation that is reflected and/or transmitted to determine temporal changes therein that are indicative of one or more dendritic growths occurring at the surface of the electrode.

Embodiments of the present disclosure substantially eliminate or at least partially address the aforementioned problems in the prior art, and enables precise identification of abnormalities in structure of electrode thereby allowing in-situ, in operandi, ex-situ or offline prognosis of electrical battery.

Additional aspects, advantages, features and objects of the present disclosure would be made apparent from the drawings and the detailed description of the illustrative embodiments construed in conjunction with the appended claims that follow.

It will be appreciated that features of the present disclosure are susceptible to being combined in various combinations without departing from the scope of the present disclosure as defined by the appended claims.

BRIEF DESCRIPTION OF THE DRAWINGS

The summary above, as well as the following detailed description of illustrative embodiments, is better understood when read in conjunction with the appended drawings. For the purpose of illustrating the present disclosure, exemplary constructions of the disclosure are shown in the drawings. However, the present disclosure is not limited to specific methods and instrumentalities disclosed herein. Moreover, those in the art will understand that the drawings are not to scale. Wherever possible, like elements have been indicated by identical numbers.

Embodiments of the present disclosure will now be described, by way of example only, with reference to the following diagrams wherein.

Figure 1:
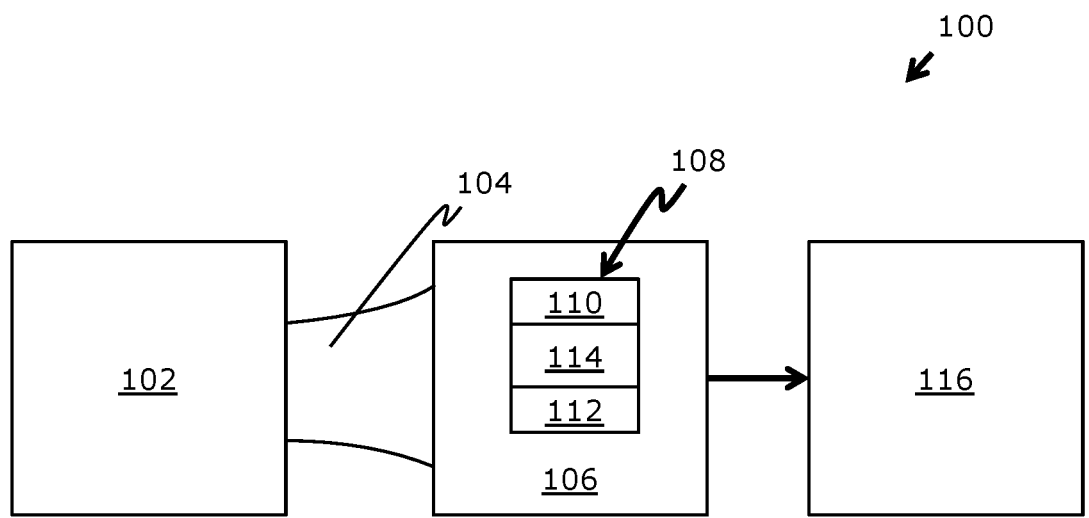
FIG. 1 is a schematic illustration of a sensing apparatus, in accordance with an embodiment of the present disclosure.

In the accompanying drawings, an underlined number is employed to represent an item over which the underlined number is positioned or an item to which the underlined number is adjacent. A non-underlined number relates to an item identified by a line linking the non-underlined number to the item. When a number is non-underlined and accompanied by an associated arrow, the non-underlined number is used to identify a general item at which the arrow is pointing.

DETAILED DESCRIPTION OF EMBODIMENTS

The following detailed description illustrates embodiments of the present disclosure and ways in which they can be implemented. Although some modes of carrying out the present disclosure have been disclosed, those skilled in the art would recognize that other embodiments for carrying out or practicing the present disclosure are also possible.

In one aspect, an embodiment of the present disclosure provides a sensing apparatus that senses, when in operation, a structure of an electrode of an electrical battery, wherein the electrode is arranged to have one or more layers spatially adjacent thereto that provide a waveguide region that includes a surface of the electrode that changes in structure, for example, as a state-of-charge of the electrical battery changes, wherein the sensing apparatus includes:

(i) a source of Terahertz electromagnetic radiation, and a coupling arrangement that couples Terahertz electromagnetic radiation from the source into the waveguide region, whereat the Terahertz electromagnetic radiation interacts with one or more features present at the surface of the electrode; and (ii) a detector that receives Terahertz electromagnetic radiation that is reflected and/or transmitted through the waveguide region, and processes the Terahertz electromagnetic radiation that is reflected and/or transmitted to determine temporal changes therein that are indicative of one or more dendritic growths occurring at the surface of the electrode.

In another aspect, an embodiment of the present disclosure provides a method of (for) sensing a structure of an electrode of an electrical battery, wherein the electrode is arranged to have one or more layers spatially adjacent thereto that provide a waveguide region that includes a surface of the electrode that changes in structure as a state-of-charge of the electrical battery changes, wherein the method includes:

(i) using a sensing apparatus including a source of Terahertz electromagnetic radiation, and a coupling arrangement to couple Terahertz electromagnetic radiation from the source into the waveguide region, whereat the Terahertz electromagnetic radiation interacts with one or more features present at the surface of the electrode; and (ii) using a detector to receive Terahertz electromagnetic radiation that is reflected and/or transmitted through the waveguide region, and to process the Terahertz electromagnetic radiation that is reflected and/or transmitted to determine temporal changes therein that are indicative of one or more dendritic growths occurring at the surface of the electrode.

The present disclosure provides a sensing apparatus for sensing a structure of an electrode and a method of sensing the structures of the electrode. Typically, the sensing apparatus as described herein, operates to monitor health of an electrical battery comprising the electrode by monitoring the structure of the electrode. Specifically, the sensing apparatus does not merely operate to monitor operational conditions associated with the electrical battery to monitor health thereof. Alternatively, the sensing apparatus monitors behaviour of the electrode in the electrical battery and internal state thereof, continuously over time. Beneficially, monitoring such internal state of the electrical battery enables identification of structural irregularities in the electrode and/or any constituent part of the electrical battery. In an example, the structural irregularities are caused due to formation of a dendrite onto a surface of the electrode. In another example, the structural irregularities are caused due to degradation of the electrode, for example, due to corrosion of metal present on the surface of the electrode. Subsequently, identifying such structural disordering in initial stage prevents occurrence of hazardous events thereby preventing risks associated with the electrical battery such as leakage, exothermic reaction, thermal runaway, multiple cell failure, venting, rupture, explosions, fire, short-circuit, failure, and so forth. Beneficially, the sensing apparatus overcomes problems owing to complexity and inter-dependence of physical and chemical processes in the electrical battery, to predict degradation thereof, over its operating lifetime owing to aging and/or flash build-up of dendrites over operation. In this regard, the sensing apparatus identifies degradation in terms of capacity, power fade and safety risks over operating lifetime of the electrical battery.

It will be appreciated that the sensing apparatus can be employed (the method may be implemented) to sense a structure of any electrical battery i.e. a primary battery or a secondary battery. Pursuant to embodiments of the present disclosure, the sensing apparatus is employed to sense a structure of secondary battery that is rechargeable.

Beneficially, the sensing apparatus monitors (i.e. the method is implemented to monitor) health of the electrical battery by identifying an internal state of the electrical battery that further indicates one or more dendritic growths occurring at the surface of the electrode in the electrical battery. Specifically, the 'internal state' of the electrical battery refers to electrochemical construct of the battery. In this regard, monitoring the internal state of the electrical battery means monitoring of internal constituents, for example, one or more electrochemical cells comprising the electrical battery. It will be appreciated that an electrochemical cell comprises at least one electrode and electrolyte. Subsequently, the sensing apparatus monitors health of the electrical battery based on detected internal abnormalities in the internal state of the electrical battery. It will be appreciated that internal abnormality refers to any deviation, for example, structural deviation, due to manufacturing faults, due to physical or chemical change that occur naturally over time, due to operational conditions of the electrical battery, and the likes, in the internal state of the electrical battery.

It will be appreciated that the sensing apparatus and method described herein overcome shortcomings associated with presently utilized Battery management systems deployed for analysis of health of an electrical battery. It will be appreciated that the electrical battery consists of one or more cells, wherein a cell further comprises at least two electrodes. Therefore, the sensing apparatus and method are not limited to sensing a structure of a given electrode in the electrical battery. Alternatively, the sensing apparatus is employed to sense a structure of each of the cell comprised in each of the one or more cells in the electrical battery. Additionally, the sensing apparatus is operable to sense structure of each of electrode of the electrical battery to analyse health thereof.

It will be appreciated that the sensing apparatus can be implemented for monitoring health of the electrode and/or the electrical battery when the electrode and/or the electrical battery is in-situ or in-situ and in operandi. Moreover, the sensing apparatus measures characteristics of the electrode and/or the electrical battery, by employing the source and the detector (as discussed in detail later, herein), continually or regularly to monitor health thereof, thereby ensuring safety of operation of the electrode in an appliance where it is installed.

Moreover, optionally, the sensing apparatus may operate in conjunction with a battery management system (BMS); wherein the sensing apparatus sends any significant information that may relate to indications of poor health or hazardous operation of the electrode in the appliance to the BMS.

In an instance, the sensing apparatus is employed for monitoring health of the electrical battery in in-situ mode of the electrical battery, wherein the sensing apparatus takes measurements for the electrical battery without removal thereof from an appliance where it is installed, for example, at service station of electric vehicle. In another instance, the sensing apparatus is employed for monitoring health of an electrical battery in ex-situ mode of the electrical battery, wherein the sensing apparatus takes measurements for the electrical battery after removal thereof from an appliance where it was installed. In this regard, the measurements can be carried out by installing the removed electrical battery into a maintenance set-up. In yet another instance, the sensing apparatus is employed for monitoring health of an electrical battery in isolated mode of the electrical battery. In this regard, measurements can be carried out by installing the electrical battery into a maintenance set-up, for example, for quality-control measurements after manufacturing of the electrical battery. Additionally, such measurements relating to the electrical battery may be uploaded to a BMS of an appliance where the electrical battery will be installed.

Throughout the present disclosure, the term "electrical battery" refers to a device consisting of an electrochemical cell or a set of electrochemical cells, wherein the device is employed to generate electrical current, for example, to power electrical devices. Optionally, the electrical battery is charged electrically to provide a static potential for power (or released electrical charge). Optionally, the set of electrochemical cells may be arranged in a series configuration, a parallel configuration, or a combination thereof, for operation thereof. Optionally, the electrical battery houses the set of electrochemical cells, with housing, electrical connections and control module (for example, Battery management systems) for control and protection of the set of the electrochemical cells.

Moreover, the term "electrochemical cell" refers to a device that generates electrical energy from chemical reactions or uses electrical energy to cause chemical reactions. Generally, the electrochemical cell comprises of a positively charged electrode, a negatively charged electrode and an electrolytic medium for facilitating flow of charges therein. Examples of electrochemical cell include, but are not limited to, Voltaic cell or Galvanic cell, Electrolytic cell, primary cell, secondary cell, half-cell, and fuel cell.

Typically, in a state of operation of the electrical battery, wherein an electrochemical cell of the electrical battery operates to supply power to a load, a positive terminal of the electrical battery is termed as cathode and a negative terminal of the electrical battery is termed as anode. It will be appreciated that the load is an external circuit that consumes power. In such case, a flow of electrons is observed from the negative terminal (namely, anode) to the positive terminal (namely, cathode), via the load. Moreover, the electrical battery is employed to supply power for operation of a multitude of electrical devices such as flashlights, torches, toys, remote devices, mobile phones, electric vehicles, laptops, computers, clocks, smart grids, homes and commercial buildings, industry and so forth. Optionally, the electrical battery is classified based on a type of electrochemical cell employed for construction thereof. In such case, examples of the electrical battery include, but are not limited to, Alkaline battery, Lithium-ion battery, Hydrogen cell battery, Lead Acid battery, Zinc-Air battery, Nickel-Metal Hydride batteries, Aluminium-ion battery, Carbon battery, Flow battery, Glass battery, Magnesium-ion battery, Molten salt battery, Nickel-cadmium battery, Nickel hydrogen battery, Nickel-iron battery, Nickel-zinc battery, Organic radical battery, Polymer-based battery, Polysulfide bromide battery, Potassium-ion battery, Sand battery, Silicon air battery, Silver-zinc battery, Silver calcium battery, Silver-cadmium battery, Sodium-ion battery, Sodium-sulphur battery, Solid-state battery, Super iron battery, UltraBattery, and Zinc-ion battery.

The sensing apparatus that, when in operation, senses the structure of the electrode of the electrical battery. Throughout the present disclosure, the term "electrode" refers to an electrical conductor employed to establish a contact with a non-metallic part of a circuit of the electrochemical cell. Optionally, the non-metallic part of the circuit of the electrochemical cell is implemented using an electrolyte, a semiconductor, a vacuum area, air, and so forth. Pursuant to embodiments of the present disclosure, the electrode is an electrical conductor that establishes a contact between the load (namely, the external circuit that consumes power) and the electrolyte. Moreover, a surface of the electrode serves as a location for exchange of electrons. Optionally, the surface of the electrode serves as a location to establish oxidation-reduction equilibrium between the electrode and the electrolyte. It will be appreciated that the electrode serves as an anode at a first instance and as a cathode at a second instance. Subsequently, the surface of the electrode facilitates oxidation thereon, at the first instance, and reduction thereon, at the second instance. It will be appreciated that the term 'electrolyte' refers to a chemical compound that dissociates into ions, thereby enabling flow of electric charge therethrough. Notably, the electrolyte enables flow electric charge due to movement if ions therein, rather than flow of electrons. Moreover, optionally, the electrode of the electrochemical cell may further comprise catalysing agent. Typically, the catalysing agent accelerates a rate of chemical reaction occurring at the electrode. Examples of catalysing agent include, but are not limited to, hydrogen peroxide ($H_2O_2$), transition metals such as nickel, vanadium oxide, palladium, platinum, gold, ruthenium, rhodium, iridium, and so forth, and light.

Optionally, the electrode of the electrical battery is composed using at least one of: a metal, a metal compound, a hydrogen compound, a carbon compound, glass. It will be appreciated that a type of the electrode and the electrolyte depends on a type of the electrochemical cell consisted in the electrical battery. In case of an alkaline electrical battery, the electrode may be composed of, for example, Zinc, Zinc oxide ($ZnO_2$), and Manganese dioxide ($MnO_2$), and the electrolyte may be composed of, for example, Potassium hydroxide (KOH). In case of a Nickel-Cadmium electrical battery, the electrode may be composed of, for example, Cadmium oxide (CdO) and Nickel(II) hydroxide (NiOOH), and the electrolyte is composed of, for example, Potassium hydroxide (KOH), Lithium hydroxide (LiOH), and Sodium hydroxide (NaOH). In case of a lead acid electrical battery, the electrode may be composed of Lead (Pb) and Lead oxide ($PbO_2$), and the electrolyte may be composed of sulphuric acid and water ($H_2SO_4$ and $H_2O$).

Moreover, herein, the term 'structure' may also refer to an irregularity (anomaly) on the surface of the electrode and/or characteristic aspects on the surface of the electrode.

In an example implementation of the present disclosure, the sensing apparatus is operable to (namely configure to) sense the structure of the electrical battery, wherein the electrical battery is implemented by way of a Lithium-ion battery. Subsequently, the Lithium-ion battery comprises of a plurality of Lithium-ion cells. In such case, each of the electrochemical cell comprises of electrodes (such as a negatively charged electrode and a positively charged electrode), current collectors, a separator and an electrolytic medium (namely, electrolyte) therein. Generally, the negative electrode of the Lithium-ion cell is made from carbon, the positive electrode is made from a metal oxide, a polyanion, or a spinel, and the electrolytic medium is composed of a lithium salt in an organic solvent. In an example, the negative electrode (namely, anode) is made of graphitic carbons, the positive electrode (namely, cathode) is made of Lithium Cobalt oxide ($LiCoO_2$) and the electrolytic medium is composed of a mixture of alkyl carbonates, di-methyl carbonates, di-ethyl carbonates, ethyl-methyl carbonates, and Lithium hexafluorophosphate ($LiPF_6$) salt. It will be appreciated that electrochemical roles of the electrodes reverse between anode and cathode, depending on a direction of current flow through the electrochemical cell.

A half-reaction occurring at the cathode is depicted as:

$$CoO_2 + Li^+ + e^- \Longleftrightarrow LiCoO_2$$

A half-reaction occurring at the anode is depicted as:

$$LiC_6 \Longleftrightarrow C_6 + Li^+ + e^-$$

Subsequently, a full reaction occurring in the Lithium-ion electrochemical cell is depicted as:

$$LiC_6 + CoO_2 \Longleftrightarrow C_6 + LiCoO_2$$

Additionally, optionally, the Lithium-ion cell comprises of current collector. Typically, the Lithium-ion cell comprises of a positive current collector and a negative current collector, such that the positive current collector is attached to the positive electrode and the negative current collector is attached to the negative electrode. Beneficially, the current collectors ensure uniform distribution of electric charge in electrode. Moreover, the current collectors serve as a holder of active substances in the electrode. Optionally, the positive current collector is composed of Aluminium (Al) and the negative current collector is composed of Copper (Cu). Beneficially, the use of copper for manufacturing of the negative current collector prevents break-down of the negative electrode owing to vigorous lithium reaction thereat.

Furthermore, the electrochemical cell comprises of a separator between the positive electrode and the negative electrode. The separator allows for flow of ions therethrough. Notably, the separator is composed of a material that is permeable, porous, allows ionic conductivity, provides electrical conductivity, and provides chemical compatibility with electrolyte. Optionally, the separator is composed of wood, rubber, glass-fibre mat, cellulose, polyvinyl chloride (PVC), polyethene, and so forth.

Notably, the anode and the cathode of the Lithium-ion cell stores Lithium. In a discharge state of operation of, wherein the electrochemical cell operates to supply power to the load, the electrolyte carries positively charged lithium ions from the anode to the cathode and vice-versa, through the separator. The movement of the Lithium ions creates free electrons in the anode which results in generation of electric charge at the positive current collector to produce electric current. Moreover, the electric current flows from the positive current collector, through the load to be powered, to the negative current collector. In a charging state of operation, complete opposite of the aforesaid process occurs thereby making the process reversible and hence the electrical battery rechargeable.

It will be appreciated that during a state of operation, the electrode of the electrochemical cell undergoes decomposition thereby leading to formation of Solid Interphase Layer (SEI) on the surface. The said SEI layer is formed due to decomposition of the electrode and the electrolyte of the cell. Typically, the SEI layer is an electronically insulating and ionically conducting passivation layer. In other words, the SEI allows flow of, for example, Lithium ions (Li+) and blocks flow of electrons in the electrolyte to prevent further decomposition of the electrolyte and to ensure continued electrochemical reactions. Notably, the SEI is formed at the surface of the electrode, between the electrode and the electrolyte, acting as a solid electrolyte. Therefore, the SEI layer has important implications for the performance of the electrode, the cell, and subsequently, the electrical battery. The SEI layer can be analysed to derive comprehension relating to shelf and cycle life in the cell, capacity of the cell, and safety of the cell.

Moreover, the surface of the electrode is sensed so as to identify formation of dendrites thereon. Notably, the dendrites refer to whiskers or spiny projections of, for example, a metal onto a surface of electrode. In case of lithium-ion battery, the dendrites are spiny projections of lithium metal on the surface of the electrode. Optionally, the dendrites grow on a surface of the negative electrode (namely, anode) of the electrical battery. Typically, formation of the dendrites on the surface of the electrode, in the electrical battery leads to significant reduction in performance of the electrode, thereby reducing efficiency and lifespan of the electrical battery, while simultaneously increasing safety concerns associated therewith. Optionally, the dendrites growing on the anode of the electrical battery pierce through the separator between the anode and cathode to make a physical contact with the cathode, thereby causing short-circuit in the electrical battery that may further lead to spontaneous combustion therein.

Therefore, the surface of the electrode is sensed to comprehend a change in the structure of the electrode. It will be appreciated that the structure of the electrode refers to a construct of the electrode and/or arrangement of constituents of the electrode. Additionally, sensing the structure of the electrode enables identification of any change or deviation thereupon. It will be appreciated that the sensing apparatus may be used for routine check of the electrical battery. In such case, the surface of the electrode would not have any deviation.

Optionally, a change in structure of the electrode is observed due to formation or build-up of the SEI layer, build-up of dendrite, dissolution of current collectors (for example, Copper, Aluminium, and so forth), intercalation and exfoliation, formation of corrosive layers (for example, oxide layers like rust), particle cracking at the electrode, loss of contact between components, and so forth.

Moreover, the one or more layers of electrode is arranged spatially adjacent to provide the waveguide region. Typically, the waveguide region includes the surface of the electrode that changes in structure as the state-of-charge of the electrical battery changes. Specifically, the one or more layers of electrode arranged spatially adjacent to each other enable formation of the waveguide region therebetween. Throughout the present disclosure, the term "waveguide region" refers to a region that guides a wave through a path, with minimal loss of energy by restricting expansion of an electromagnetic wave in one or two dimensions thereof. Typically, a power of the wave reduces as a distance of destination, from the source increases. Subsequently, analysis of such wave to derive insights therefrom becomes challenging, owing to substantial decrease in power thereof. Therefore, the waveguide region confines the wave so as to prevent expansion in different dimensions during propagation thereof. Optionally, the wave is confined to an interior of the waveguide region owing to total reflection at walls of the waveguide region. Pursuant to embodiments of the present disclosure, the waveguide region guides an electromagnetic wave (namely, Terahertz electromagnetic radiation) from the source to the detector. Typically, the Terahertz electromagnetic radiation expands into three-dimensional space during propagation. However, the waveguide region restricts such expansion thereof, thereby preventing loss in energy.

Pursuant to embodiment of the present disclosure, the term "state-of-charge" refers to a polarity of the electrical battery, wherein the polarity of the electrical battery defines a direction of flow of charges therein. Optionally, the state-of-charge of the electrical battery may be charging, discharging, or idle. Moreover, it will be appreciated that a cause for the changes in the structure of the electrode is not limited to a change in state-of-charge of the electrical battery. Alternatively, the changes in the structure of the electrode may be caused due to aging, environment of operation, and the likes.

Notably, the waveguide region comprises the surface of the electrode. Specifically, the waveguide region comprises a first layer of electrode and a second layer of electrode and a separation therebetween. Optionally, the first layer of electrode is anode and the second layer of electrode is cathode. It will be appreciated that the first layer of electrode has a first end and a second end, wherein the second end forms a first wall for the separation. Similarly, a first end of the second layer of electrode forms a second wall for the separation. In such case, the waveguide region formed, comprising the first layer of electrode, the separation and the second layer of electrode, is sensed to analyse health of the first layer of electrode and the second layer of electrode. It will be appreciated that first end and second end of the first layer of electrode and the second layer of the electrode is described about a length or width of the first layer of electrode and the second layer of electrode. Subsequently, it will be appreciated that the wave (namely, the Terahertz electromagnetic wave) passing through the waveguide region typically passes through a region between the first end of the first layer of electrode and the second end of the second layer of electrode. Optionally, a spatial extent of the separation between the second end of the first layer of electrode and the first end of the second layer of electrode is in a range of 25 micrometres ($\mu$m) to 100 micrometres ($\mu$m).

Optionally, the waveguide region further comprises at least one of: air, a dielectric medium. Specifically, the air or the dielectric medium forms the separation region in the waveguide region. In this regard, the air or the dielectric medium, for example, Teflon® (RTM) may form circumambient environment of the electrode thereby comprising the waveguide region. Optionally, the waveguide region may comprise the electrolyte, a conductive layer (for example, a layer due to dendrites), and/or an insulating layer (for example, a layer due to SEI).

The one or more layers forming the waveguide region restricts expansion of wave propagating through the waveguide region. Optionally, the wave propagating through the waveguide region is an electromagnetic wave. In such case, an electromagnetic field of the electromagnetic wave may propagate through the waveguide in at least one of: Transverse Electric (TE) mode, Transverse magnetic (TM) mode, Transverse electromagnetic (TEM) mode. Such transverse modes occur owing to boundary conditions imposed on the electromagnetic wave by the one or more layers forming the waveguide region. Notably, in TE mode, an electric field (or electric lines of flux) of the electromagnetic field of the electromagnetic wave is perpendicular to a direction of propagation of the electromagnetic wave. In TM mode, a magnetic field (or magnetic lines of flux) of the electromagnetic field of the electromagnetic wave is perpendicular to the direction of propagation of the electromagnetic wave. Moreover, in the TEM mode, the electric field of the electromagnetic wave, the magnetic field of the electromagnetic wave and the direction of the propagation of the electromagnetic wave are perpendicular to each other.

Notably, broad band single mode coupling of the Terahertz (THz) electromagnetic radiation into circular and/or rectangular metal waveguides, single crystal sapphire fibres, and plastic ribbon planar waveguides is used for narrow band or Terahertz (THz) time-domain spectroscopy applications. Typically, a sub-picosecond (subps) Terahertz (THz)

propagation in all types of waveguides have high group-velocity dispersion (GVD), that results in distortion of the transmitted Terahertz (THz) electromagnetic radiation. Moreover, for metal waveguides, the group-velocity dispersion (GVD) causes excessive broadening of sub-picosecond (subps) Terahertz (THz) pulses near a cut-off frequency. However, it will be appreciated that in TEM ($TM_0$) mode, the excessive broadening of sub-picosecond (subps) Terahertz (THz) pulses will not occur for a two-wire coplanar line, a coaxial line, or a parallel plate metal waveguide that does not have the cut-off frequency. Beneficially, using the parallel plate waveguide integrated into the sensing apparatus, such as the as-manufactured parallel electrodes of the battery, allows confinement of the TEM mode. Moreover, use of parallel plate waveguide allows propagation of sub-picosecond (subps) Terahertz (THz) pulses with minimal loss and distortion.

In the present disclosure, the use of parallel plate waveguide integrated into the sensing apparatus to allow the confinement of TEM mode is referred as Parallel Plate Waveguide Mode (PPWGM). Optionally, the Parallel Plate Waveguide Mode (PPWGM) is achieved by coupling a linearly polarized electric field in a direction normal to the plane of the parallel plates of the waveguide, such that only TEM modes can exist in the waveguide. Further, single TEM mode propagation is implemented by choosing an appropriate plate separation and an even incoming field pattern with a correct beam size. The even incoming field pattern avoids coupling of other modes ($TM_1$ and $TM_2$) and as a result, the TEM mode (i.e. $TM_0$) would dominate. For an air-filled waveguide, the cut-off frequency is $f_{cm}=mc/2b$, where m=0, 1, 2, . . . , and b is the plate separation. Typically, lowest order TEM mode ($TM_0$) does not have cut-off frequency. Further, lowest order TEM mode ($TM_0$) does not have group-velocity dispersion (GVD) for perfectly conducting plates. Subsequently, the propagation losses occur due to the finite conductivity of the metal plates and can be calculated. Further, it will be appreciated that the changes on the metal plates can be detected with great sensitivity using the confinement of TEM mode in a parallel plate waveguide with proper dimensions. Moreover, a composition of the changes on the metal plate can be analysed with very high-resolution using Terahertz (THz) time-domain spectroscopy.

Typically, the Parallel Plate Waveguide Mode (PPWGM) requires a small gap between the parallel plates and several centimetre interaction lengths between the Terahertz (THz) electromagnetic field and material observed between the parallel plates, thus allowing a wide, distortion-free temporal window to be recorded. The lowest order TEM mode of the Parallel Plate Waveguide Mode (PPWGM) has low propagation losses limited only to resistive losses in a surface layer of the parallel metal plates. Further, no low frequency cut-off occurs in the lowest order TEM mode. Moreover, the propagation of the electromagnetic waves is virtually dispersionless in the lowest order TEM mode until the onset of a first higher-order TEM mode. Furthermore, due to low mode coupling, distortion free propagation of electromagnetic waves is possible even at frequencies above the onset of the first higher-order TEM mode if the waveguide is excited in fundamental mode. Subsequently, the spectral features revealed by the waveguide spectroscopy are much sharper and well defined.

Optionally, the one or more layers of the electrode providing the waveguide region forms the parallel plate waveguide. Typically, the parallel plate waveguide refers to a waveguide implemented using two flat conducting plates comprising a separator therebetween. In operation, the first layer of electrode and the second layer of electrode constitute the flat conducting plates of the parallel plate waveguide. Subsequently, the waveguide region comprises of a surface of the first layer of electrode, a surface of the second layer of electrode and electrolytic medium therebetween.

Optionally, the waveguide region, provided by the one or more layers of the electrode, has a minimum spatial extent in a range of 225 micro-metres (μm) to 300 micro-metres (μm). Optionally, the spatial extent of the waveguide region constitutes of a spatial extent of the first layer of electrode, a spatial extent of the second layer of electrode and a spatial extent of the separator therebetween. Typically, the waveguide region has minimum spatial extent in a range of 225 micrometres (μm) to 300 micrometres (μm) so as to allow loss less propagation of electromagnetic wave therethrough. In an example, the first layer of electrode has a spatial extent of 0.125 millimetres (mm), the second layer of electrode has a spatial extent of 0.75 millimetres (mm) and a separator comprises therebetween has a spatial extent of 25 micrometres (μm). In such case, a minimum spatial extent of waveguide region is (125 μm+25 μm+75 μm) 225 micrometres (μm). In another example, the first layer of electrode has a spatial extent of 0.125 millimetres (mm), the second layer of electrode has a spatial extent of 0.75 millimetres (mm) and a separator comprises therebetween has a spatial extent of 100 micrometres (μm). In such case, a minimum spatial extent of waveguide region is (125 μm+100 μm+75 μm) 300 micrometres (μm).

Optionally, the sensing apparatus advantageously employs (the method advantageously implements) the Parallel Plate Waveguide Mode (PPWGM) of the Terahertz (THz) pulses by confining the Terahertz (THz) pulses between the parallel conductive plates. Optionally, the waveguide is formed by the electrodes of the battery, the separation between the electrodes and the length of the electrodes. Optionally, the waveguide is an integrated part of the sensing apparatus as-manufactured, confining the Terahertz (THz) pulses. Optionally, the Parallel Plate Waveguide Mode (PPWGM) is induced in the waveguide, resulting in minimal loss and group velocity dispersion (GVD), thereby conserving the amplitude and the shape of the Terahertz (THz) pulses in transit through the waveguide. Beneficially, it will be appreciated that controlling both electrode separation and length of electrode to achieve subwavelength confinement allows optimal battery dimensions for the integrated sensing apparatus.

Furthermore, the sensing apparatus includes a source of Terahertz (THz) electromagnetic radiation. The Terahertz electromagnetic radiation refers to electromagnetic waves having frequency in a range of $10^{12}$ Hertz (Hz). Optionally, the source generates the Terahertz (THz) electromagnetic radiation having a frequency in a range of 0.1 Terahertz (THz) to 30 Terahertz (THz). Optionally, the sensing apparatus includes at least one source of electromagnetic radiation wherein the frequency of the electromagnetic radiation generated by the at least one source is not limited to 0.1 THz to 30 THz and therefore may include any electromagnetic radiation. Depending on the source of electromagnetic radiation selected, the radiation generated may lie in the electromagnetic spectrum between radio waves and infrared waves. Optionally, wavelengths are in range of 0.1 millimetres (mm) to 1 millimetres (mm). Optionally, the Terahertz electromagnetic radiation is non-ionizing in nature and propagates in a line of sight LOS) or non-line of sight (NLOS). Typically, the Terahertz electromagnetic radiation can penetrate through non-conductive material, has limited penetration through non-conductive semi-solid material, and cannot penetrate through liquid and metals. Subsequently, the Terahertz electromagnetic radiation demonstrates limited penetration through the electrolyte passes therethrough. Moreover, the Terahertz electromagnetic radiation depicts no or very less penetration through non-conductive layers such as separators and the SEI layer. Additionally, the Terahertz electromagnetic radiation depicts substantial decrease in power thereto owing to inability thereof in penetrating the metal of the electrode and/or dendrites on the surface of the electrode.

Moreover, optionally, the source of the Terahertz electromagnetic may be a natural source. In such case, the natural source has a temperature greater than 10 Kelvin (K). In this regard, the source of the Terahertz electromagnetic radiation may include, the sun, cosmic background radiation from extra-terrestrial sources, lightning, electrical discharges, and the likes. Optionally, the Terahertz electromagnetic radiation is generated using an artificial source. Examples of the artificial source include, but are not limited to, gyrotrons, backward wave oscillators (BO), organic gas far infrared lasers (FIR laser), Schottky diode multipliers, varactor multipliers, quantum cascade lasers (QCL), free electron lasers (FEL), synchrotron light sources, distributed feedback laser (DFB) pumped photomixing crystals, laser time division multiplexing (TDM), pulsed sources such as photoconductive, surface field, photo-Dember and optical rectification emitters, solid-state sources such as IMPATT, Gunn and resonant tunnelling diodes, high temperature superconducting materials, and other semi-conductor sources.

The sensing apparatus includes a coupling arrangement that couples Terahertz electromagnetic radiation from the source into the waveguide region, whereat the terahertz electromagnetic radiation interacts with one or more features present at the surface of the electrode. Typically, the "coupling arrangement" refers to a device that aligns or connects two entities. Pursuant to embodiments of the present disclosure, the coupling arrangement aligns the Terahertz electromagnetic radiation from the source to the waveguide region. Optionally, the coupling arrangement alters an incident angle of the Terahertz electromagnetic radiation from the source, for coupling thereto into the waveguide region. In such case, the coupling arrangement alters the incident angle of the Terahertz electromagnetic radiation at an angle greater than a critical angle, with respect to the waveguide region. In an instance, the coupling arrangement further splits the Terahertz electromagnetic radiation so as to generate multiple beams thereof. In such case, the multiple beams are coupled to various waveguide regions in the electrical battery at the same time. Beneficially, coupling multiple beams of the Terahertz electromagnetic radiation, to various waveguide regions in the electrical battery at the same time saves time and saves power for operating the sensing apparatus. In an example, the coupling arrangement operates to enable flood illumination of the waveguide region from the Terahertz electromagnetic radiation, for coupling thereto. In another example, the coupling arrangement employs grating arrangement for coupling the Terahertz electromagnetic radiation to the waveguide region. In yet another example, the coupling arrangement employs optical elements (for example, focusing lens) for coupling the Terahertz electromagnetic radiation to the waveguide region.

Optionally, the coupling arrangement employs a coupling grating. Beneficially, incident radiation beam of the Terahertz electromagnetic radiation is aligned with the coupling grating to enhance coupling of the THz electromagnetic radiation with the waveguide region. Optionally, the coupling arrangement further comprises a secondary grating that prevents coupling of unwanted electromagnetic radiations into the waveguide region. The secondary grating blocks, refracts and/or reflects the unwanted electromagnetic radiations to prevent coupling thereof. Additionally, optionally, the secondary grating is arranged in a path between the coupling grating and the source, in the coupling arrangement.

Optionally, the coupling arrangement further comprises a focusing lens. Optionally, the focusing lens is composed of Silicon. It will be appreciated that the focusing lens focusses the Terahertz electromagnetic radiation from the source into the waveguide region. Optionally, the focusing lens operates to converge the Terahertz electromagnetic radiation from the source to a location of dispersion in the waveguide region. Optionally, such location of dispersion is calculated precisely by the coupling arrangement so as to enable efficient propagation of the Terahertz electromagnetic radiation in the waveguide region. In an instance, the coupling arrangement adjust a focal point of the focusing lens to the location of dispersion so as to enable the focusing lens to converge the Terahertz electromagnetic radiation at the location of dispersion.

Furthermore, the terahertz electromagnetic radiation interacts with one or more features present at the surface of the electrode. It will be appreciated that the Terahertz electromagnetic radiation interacts with the one or more features based on a nature thereof. Moreover, the one or more features present at the surface of the electrode includes, for example, exchange of electrons from the surface of the electrode owing to reaction within the electrical battery, a formation of SEI layer onto the surface of the electrode, formation of dendrites onto the surface of the electrode, breaking or chipping away of particles of electrode from the surface, and so forth. Additionally, the Terahertz electromagnetic radiation interact with the one or more features on the surface of the electrode to completely penetrate, partially penetrate, or fully reflect back through the one or more features, based on a nature of the one or more features.

Optionally, the Terahertz electromagnetic radiation propagates within a waveguide region as an evanescent wave that is bound to a spatial region adjacent to the surface of the electrode. Typically, the Terahertz electromagnetic radiation propagates as the evanescent wave in the waveguide region such that the energy of the evanescent wave is spatially concentrated in vicinity of the source of the Terahertz electromagnetic radiation. Specifically, the Terahertz electromagnetic radiation are propagated as the evanescent wave when the coupling arrangement alters the Terahertz electromagnetic radiation to produce a sinusoidal wave therefrom. Moreover, upon incident of the sinusoidal Terahertz electromagnetic radiation at an angle greater that a critical angle of the waveguide region so as to enable total internal reflection in the spatial region adjacent to the surface of the electrode (typically, from a wall of waveguide region), the sinusoidal Terahertz electromagnetic radiation is converted to evanescent wave. Notably, the intensity of the evanescent wave decays exponentially with increase in distance from an interface of formation thereof. It will be appreciated that due to total internal reflection, a reflected wave and a refracted wave is produced from the evanescent wave during propagation thereof. Subsequently, optionally, the reflected wave is operable to traverse through the waveguide region and the refracted wave is detected by the detector (as discussed in detail later, herein) for analysing the health of the electrical battery. Optionally, a reflected wave produced after complete transversal of the waveguide region is further detected for analysing the health of the electrical battery.

The sensing apparatus includes the detector that receives Terahertz electromagnetic radiation that is reflected and/or transmitted through the waveguide region, and processes the Terahertz electromagnetic radiation that is reflected and/or transmitted to determine temporal changes therein that are indicative of one or more dendritic growths occurring at the surface of the electrode. Throughout the present disclosure, the term "detector" refers to a device or a circuitry that is operable to identify and discern a particular object or substance. Pursuant to embodiments of the present disclosure, the detector is a device that is operable to identify the Terahertz electromagnetic radiation that is reflected and/or transmitted through the waveguide region. Optionally, the detector further detects the evanescent wave that is refracted from the spatial region adjacent to the surface of the electrodes (namely, the wall of the waveguide region). Examples of detector include, but are not limited to, direct detector, heterodyne detector, Schottky barrier detector, pair braking detector, hot electron mixer detector, and field-effect transistor detector.

In an instance, the waveguide region is implemented by way of a parallel plate waveguide, wherein the first layer of electrode and the second layer of electrode operate as parallel plate consisting of the waveguide region therebetween. In such case, the detector may be placed in proximity of at least one of: the first end of the first layer of electrode, forming the first wall of the waveguide region, the second end of the second layer of electrode forming the second wall of the waveguide region. In another instance, the detector, for detecting the Terahertz electromagnetic radiation that is reflected and/or transmitted through the waveguide region, is arranged in a transverse axis with respect to an axis of the waveguide region.

It will be appreciated that the sensing apparatus may be operated (the method may be implemented) during different cycle life (namely, state-of-charge) in the cell for example, a discharge cycle of the cell, a charge cycle of the cell. Additionally, the sensing apparatus may be operated (the method may be implemented) at various intervals of time within a life-cycle of the electrical battery. Subsequently, readings relating to received Terahertz electromagnetic radiation that is reflected and/or transmitted through the waveguide region, acquired throughout time such as during different cycle life in the cell, and the various intervals of time within a life-cycle of the electrical battery is stored in a memory associated with the detector. Moreover, optionally, the detector compares such reading acquired throughout the time stored in the memory with a current reading to generate a health report for the electrical battery. Additionally, optionally, the detector may further process the current reading relating to received Terahertz electromagnetic radiation that is reflected and/or transmitted through the waveguide region to identify abnormalities owing to operational conditions of the electrical battery.

Additionally, the detector processes the Terahertz electromagnetic radiation that is reflected and/or transmitted through the waveguide region to determine temporal changes therein that are indicative of one or more dendritic growths occurring at the surface of the electrode. In an instance, when there is a substantial decrease in power of the received Terahertz electromagnetic radiation that is reflected and/or transmitted, the detector analyses extent of absorption of the Terahertz electromagnetic radiation (for example, in terms of attenuated power thereof) by the waveguide region. Subsequently, the detector apprehends presence of metallic layer on the surface of the electrode comprised in the waveguide region or presence of liquid in the waveguide region. Therefore, detecting such temporal changes enables identification of presence of metallic layer, wherein the metallic layer may be formed due to one or more dendritic growth (namely, dendrites) onto the surface of the electrode.

Optionally, the sensing apparatus further includes collimating lens to direct the Terahertz electromagnetic radiation that is reflected and/or transmitted through the waveguide region to the detector. Beneficially, the collimating lens prevents dispersion of the Terahertz electromagnetic radiation that is reflected and/or transmitted through the waveguide region in unwanted directions and enables parallel propagation thereof. Additionally, the collimating lens allows the detector or a user of the sensing apparatus to control a field of view, collection efficiency, and spatial resolution of the detector, and further enables configuration of collection angle for efficient collection and sampling of the Terahertz electromagnetic radiation that is reflected and/or transmitted through the waveguide region.

Optionally, the source generates, when in operation, the Terahertz electromagnetic radiation as pulsed radiation, and the detector operates to determine temporal signatures of the pulsed radiation that is reflected and/or transmitted to determine temporal changes therein that are indicative of one or more dendritic growths occurring at the surface of the electrode. In such case, the source of the Terahertz electromagnetic radiation may be a pulsed source. Specifically, the pulsed radiation is a non-continuous Terahertz electromagnetic radiation, wherein the power appears in pulses of a given duration at a given repetition rate. In other words, the pulsed source generates a pulsed Terahertz electromagnetic radiation, such that a power of the pulsed Terahertz electromagnetic radiation occurs in a non-continuous manner for a given duration, in regular intervals of time. Moreover, such pulsed Terahertz electromagnetic radiation propagates through the waveguide region and is further received by the detector. Typically, the detector operates to analyse the pulsed Terahertz electromagnetic radiation that is reflected and/or transmitted through the waveguide region to apprehend interaction thereof with the one or more features at the surface of the electrode. Subsequently, the pulsed Terahertz electromagnetic radiation exhibit temporal signatures based on interaction thereof, with the one or more features at the surface of the electrode. Such temporal signatures of the pulsed Terahertz electromagnetic radiation are detected by the detector to further determine temporal changes on the surface of the electrode.

Optionally, the sensing apparatus further includes an aperture between the waveguide region and the detector. Typically, the aperture controls an amount of Terahertz electromagnetic radiation reaching the detector from the waveguide region. In this regard, the aperture controls an amplitude of the Terahertz electromagnetic radiation reaching the detector. Optionally, the sensing apparatus further comprises a scattering probe. Typically, the scattering probe directs the Terahertz electromagnetic radiation reflected and/or transmitted through the waveguide region to the detector. In this regard, the scattering probe directs the Terahertz electromagnetic radiation by scattering thereto, for example, at an angle.

Moreover, optionally, the sensing apparatus comprises a pouch cell and optical windows, wherein the pouch cell forms an outer casing for the electrical battery. In this regard, the pouch cell encapsulates components (such as, one or more electrochemical cells, electrodes, electrolytes, and the like) of the electrical battery so as to provide protection against degradation owing to humidity, short circuits, corrosion, temperature, and the like. Optionally, such pouch cell may be a soft outer casing in form of a pouch, a solid (namely, hard) outer casing in form of hard cell, or a combination thereof. In an example, the pouch cell may be manufactured using layer(s) of plastic and/or Aluminium lamination. Additionally, the pouch cell is sealed upon assembling of the one or more electrochemical cells or electrical battery therein, by employing, for example, heat.

Beneficially, such pouch cell protects the electrical battery deployed in various appliances (for example, electric vehicles, electronic devices, electromechanical appliances, and the like). Specifically, the pouch cell protects the electrical battery from mechanical stresses including deformation and/or tearing that may lead to misalignment and/or leakage of electrodes in the electrical battery; and thermal stresses that may lead to thermal runaway, sparks, short circuits, and the like.

Optionally, the sensing apparatus comprises optical windows. Notably, the pouch cell acts as a barrier (namely, obstacle) for Terahertz electromagnetic radiations owing to conductive nature thereof. Therefore, optical windows, specifically, optically transparent Terahertz (THz) windows are employed to allow entering of Terahertz electromagnetic radiation from the source and exit thereof, from the waveguide region in the electrode, via the pouch cell.

Optionally, a first transparent THz window is placed at a bottom of a pouch cell enclosing the electrical battery. In this regard, the first transparent THz window is placed between the coupling arrangement and the electrode of the electrical battery. Moreover, a second transparent THz window is placed at a top of the pouch cell, wherein the top is a side opposite to the bottom. In this regard, the second transparent THz window is placed between the electrode of the electrical battery and the detector. The first transparent THz window couples the Terahertz electromagnetic radiations from the source to waveguide region, via the pouch cell, without any loss. The second transparent THz window collects the Terahertz electromagnetic radiations from the waveguide region to the detector, via the pouch cell, without any loss.

Beneficially, the sensing apparatus, by way of transparent THz windows, enable prognostic detection and signalling of any change in structure of the electrode while the electrode (in the electrical battery) is in use (namely, in-situ) by, for example, an electric vehicle (EV), an appliance. Additionally, the transparent THz windows enables isolation, removal and containment of the electrode when the electrode is operated in hazardous operation and further reveal nature of risk associated with the electrode.

Additionally, optionally, the sensing apparatus may be employed (the method may be implemented) for second life of an electrode and/or an electrical battery, conditioning of recycled an electrode and/or an electrical battery, refurbishment of an electrode and/or an electrical battery. Specifically, the sensing apparatus (the method implemented) provides calibration, alignment baseline, and quality control for an electrode (in its "as manufactured" state) and/or an electrical battery.

Moreover, optionally, observations relating to an electrode and/or an electrical battery from the sensing apparatus (the method implemented) may be uploaded to a battery management system of an appliance where the electrode and/or the electrical battery is installed.

In an example implementation of the sensing apparatus, the source and the coupling arrangement are arranged in a transverse axis with respect to an axis of the waveguide region. Furthermore, the detector is arranged in an axis that is perpendicular to the axis of the waveguide region. In another example implementation of the sensing apparatus, the source, the coupling arrangement, the aperture and the detector are arranged in transverse axis with respect to an axis of the waveguide region. In yet another example implementation of the sensing apparatus, the source, the coupling arrangement and the scattering probe are arranged in a transverse axis with respect to the axis of the waveguide region. Additionally, the detector is inclined at an angle, in an axis that is perpendicular to the axis of the waveguide region. It will be appreciated that various configurations of arrangement of components of the sensing apparatus are possible and subsequently, auxiliary components may be employed by the sensing apparatus so as to enable efficient propagation of the Terahertz electromagnetic radiation from the source, via the waveguide region, to the detector so as to enable the detector to identify temporal changes onto the surface of the electrode.

The present disclosure also relates to the method as described above. Various embodiments and variants disclosed above apply mutatis mutandis to the method.

The method of the present disclosure enables precise identification of abnormalities in structure of electrode thereby allowing in-situ, in operandi, ex-situ or offline prognosis of electrical battery. Typically, the method as described above, may be implemented for monitoring health of an electrical battery comprising the electrode by monitoring the structure of the electrode. Specifically, the method may not be merely implemented to monitor operational conditions associated with the electrical battery to monitor health thereof. Alternatively, the method may be implemented to monitor behaviour of the electrode in the electrical battery and internal state thereof, continuously over time. Beneficially, monitoring such internal state of the electrical battery enables identification of structural irregularities in the electrode and/or any constituent part of the electrical battery.

Optionally, the Terahertz electromagnetic radiation propagates within the waveguide region as an evanescent wave that is bound to a spatial region adjacent to the surface of the electrode.

Optionally, the method includes generating the Terahertz electromagnetic radiation as pulsed radiation, and receiving the pulsed radiation that is reflected and/or transmitted through the waveguide region to determine temporal signatures of the pulsed radiation that is reflected and/or transmitted, to determine temporal changes therein that are indicative of one or more dendritic growths occurring at the surface of the electrode.

Optionally, the method includes generating the Terahertz electromagnetic radiation having a frequency in a range of 0.1 Terahertz (THz) to 30 Terahertz (THz).

Optionally, the method includes altering an incident angle of the Terahertz electromagnetic radiation from the source, for coupling thereto into the waveguide region.

Optionally, the waveguide region, provided by the one or more layers of the electrode, has a minimum spatial extent in a range of 225 micro-metres (µm) to 300 micro-metres (µm).

Optionally, the method further includes employing a collimating lens to direct the Terahertz electromagnetic radiation that is reflected and/or transmitted through the waveguide region to the detector.

Optionally, the waveguide region further comprises any one of: air, a dielectric medium.

Optionally, the electrode of the electrical battery is composed using at least one of: a metal, a metal compound, a hydrogen compound, a carbon compound.

Optionally, the sensing apparatus comprises a pouch cell and optical windows, wherein the pouch cell forms an outer casing for the electrical battery.

DETAILED DESCRIPTION OF THE DRAWINGS

Referring to FIG. 1, there is shown a schematic illustration of a sensing apparatus 100, in accordance with an embodiment of the present disclosure. Notably, the sensing apparatus 100 senses, when in operation, a structure of an electrode 108 of an electrical battery 106. Additionally, the electrode 108 is arranged to have one or more layers (depicted as layers 110 and 112) spatially adjacent thereto. The layers 110 and 112 provide a waveguide region 114. It will be appreciated that the wave guide region 114 includes a surface (not shown) of the layers 110 and 112 that change in structure as a state-of-charge of the electrical battery 106 changes. As shown, the sensing apparatus 100 includes a source 102 of Terahertz electromagnetic radiation, and a coupling arrangement 104 that couples Terahertz electromagnetic radiation from the source 102 into the waveguide region 114. Specifically, the Terahertz electromagnetic radiation interacts with one or more features present at the surface of the layers 110 and 112 of the electrode 108. Additionally, the sensing apparatus 100 includes a detector 116 that receives Terahertz electromagnetic radiation that is reflected and/or transmitted through the waveguide region 114. Moreover, the detector 116 processes the Terahertz electromagnetic radiation that is reflected and/or transmitted to determine temporal changes in the waveguide region 114 that are indicative of one or more dendritic growths occurring at the surface of the layers 110 and 112 of the electrode 108.

It may be understood by a person skilled in the art that the FIG. 1 includes a simplified illustration of the sensing apparatus 100 for sake of clarity only, which should not unduly limit the scope of the claims herein. The person skilled in the art will recognize many variations, alternatives, and modifications of embodiments of the present disclosure.

Figure 2A:
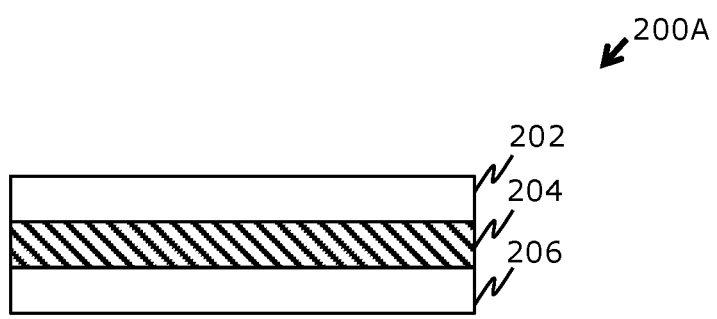
FIGS. 2A and 2B are schematic illustrations of electrodes in an electrical battery, in accordance with different embodiments of the present disclosure.
Figure 2B:
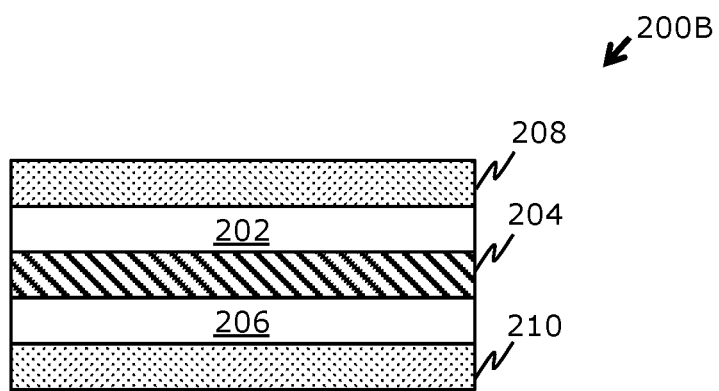

Referring to FIGS. 2A and 2B, illustrated are schematic illustrations of electrodes in an electrical battery, in accordance with different embodiments of the present disclosure. As shown in FIG. 2A, electrodes 200A includes a first layer of electrode 202, a second layer of electrode 206 and a separator 204 therebetween. In a state of operation of the electrode 200A, the first layer of electrode 202 forms positively charged electrode (namely, anode) and the second layer of electrode 206 forms negatively charged electrode (namely, cathode).

Furthermore, as shown in FIG. 2B, electrodes 200B includes current collectors (depicted as current collectors 208 and 210). In a state of operation of the electrode 2006, the first layer of electrode 202 forms anode and the second layer of electrode 206 forms cathode. Moreover, the current collector 208 connected to the first layer of electrode 202 (namely, anode) is manufactured using Copper (Cu) and the current collector 210 connected to the second layer of electrode 206 (namely, cathode) is manufactured using Aluminium (Al).

It may be understood by a person skilled in the art that the FIGS. 2A and 2B include simplified illustrations of the electrodes 200A and 200B for sake of clarity, which should not unduly limit the scope of the claims herein. The person skilled in the art will recognize many variations, alternatives, and modifications of embodiments of the present disclosure.

Figure 3:
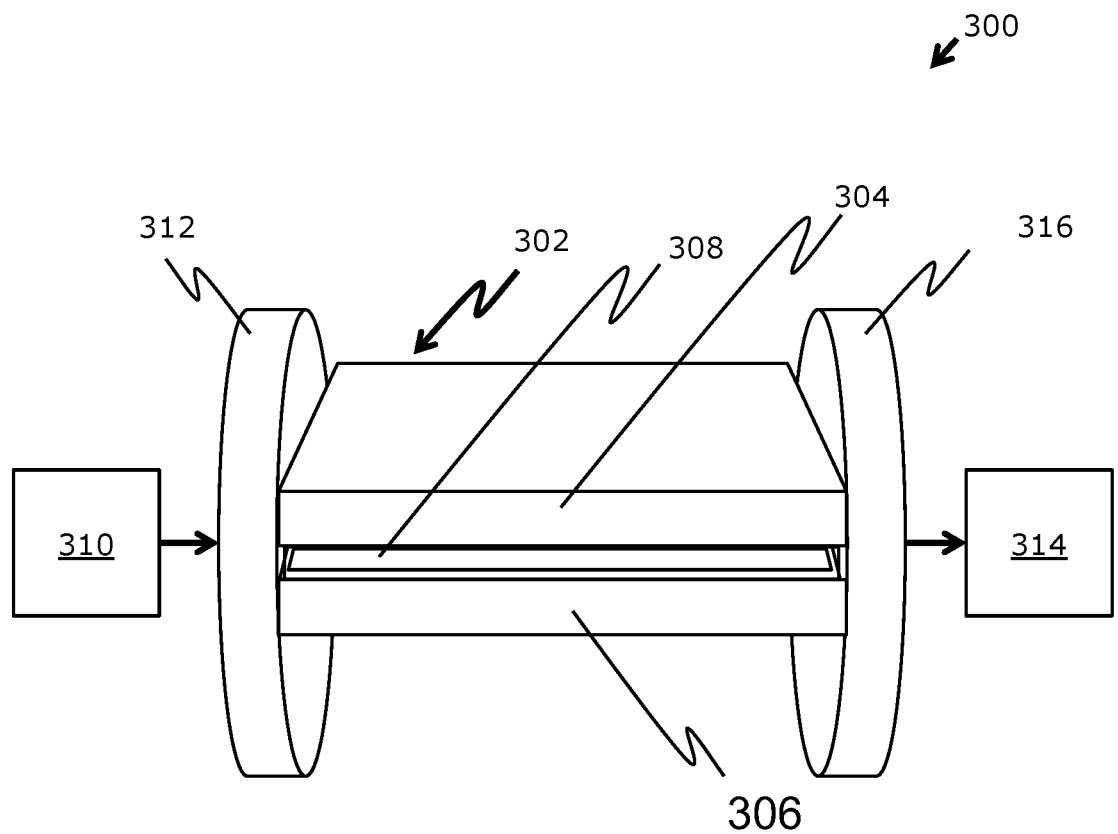
FIG. 3 is a schematic illustration of a sensing apparatus, in accordance with an exemplary implementation of the present disclosure.

Referring to FIG. 3, illustrated is a schematic illustration of a sensing apparatus 300, in accordance with an exemplary implementation of the present disclosure. As shown, the sensing apparatus 300 senses a structure of an electrode 302 of an electrical battery (not shown). The electrode 302 is arranged to have one or more layers (depicted as layers 304 and 306) adjacent thereto. Moreover, the layers 304 and 306 provide a waveguide region 308 that includes surface of the layers 304 and 306 of the electrode 302. The sensing apparatus 300 includes a source 310 of Terahertz electromagnetic radiation, and a coupling arrangement 312 that couples Terahertz electromagnetic radiation from the source 310 into the waveguide region 308. Furthermore, the sensing apparatus includes a detector 314 that receives Terahertz electromagnetic radiation that is reflected and/or transmitted through the waveguide region 308. The detector 314 processes the Terahertz electromagnetic radiation that is reflected and/or transmitted to determine temporal changes therein that are indicative of one or more dendritic growths occurring at the surface of the layers 304 and 306 of the electrode 302. Additionally, the sensing apparatus further includes a collimating lens 316 to direct the Terahertz electromagnetic radiation that is reflected and/or transmitted through the waveguide region 308 to the detector 314.

Figure 4:
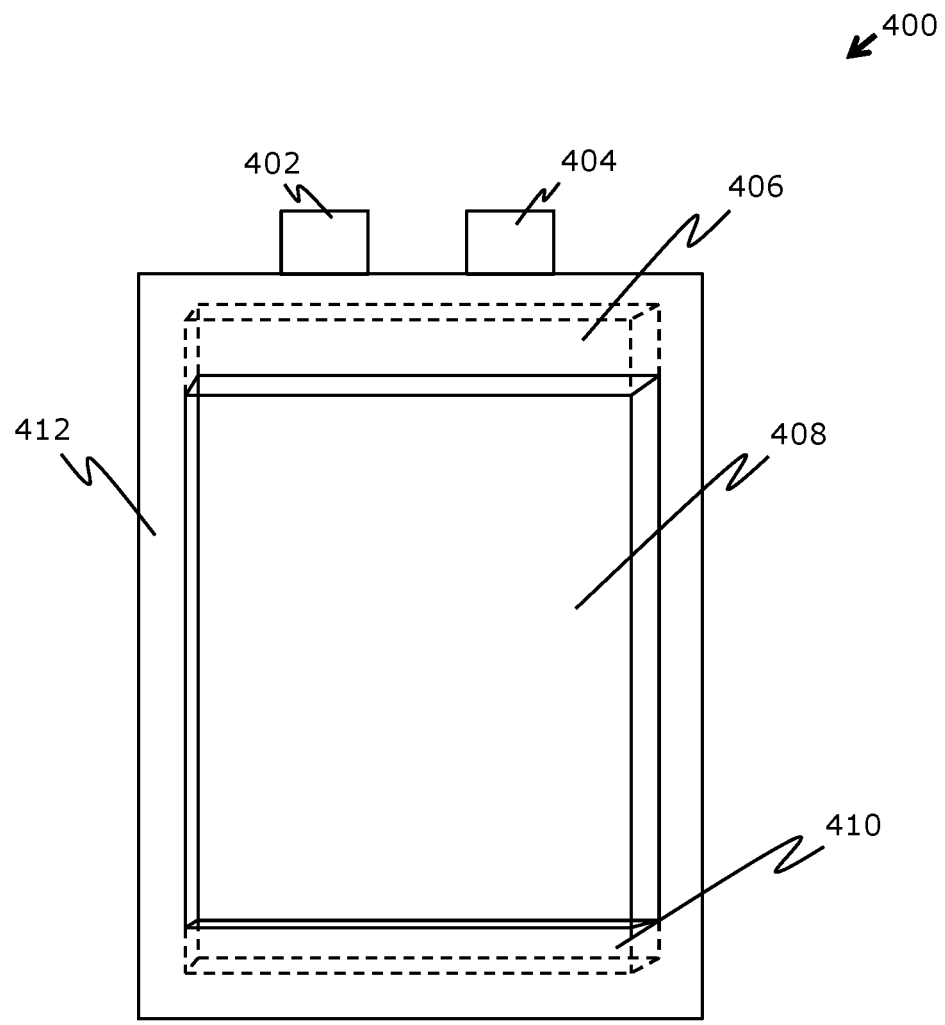
FIG. 4 is a schematic illustration of a sensing apparatus with pouch cell and transparent Terahertz (THz) windows, in accordance with an embodiment of the present disclosure.

Referring to FIG. 4, there is shown a schematic illustration of a sensing apparatus 400 with pouch cell and transparent Terahertz (THz) windows, in accordance with an embodiment of the present disclosure. As shown, the sensing apparatus 400 consists of a negative electrode 402, a positive electrode 404. Moreover, the pouch cell 408 acts as an outer casing for electrical battery (not shown) placed therein. Additionally, the sensing apparatus 400 comprises a first transparent THz window 406 and a second transparent THz window 410, wherein the first transparent THz window 406 is for coupling a waveguide region in the electrical battery with a detector (not shown) and the second transparent THz window 410 is for coupling the waveguide region in the electrical battery with a coupling arrangement of a source (not shown). Furthermore, an enclosing 412 in the sensing apparatus 400 is a heat-sealed folded edge that provides lamination to the electrical battery and the sensing apparatus 400.

It may be understood by a person skilled in the art that the FIG. 4 is merely an example, which should not unduly limit the scope of the claims herein. The person skilled in the art will recognize many variations, alternatives, and modifications of embodiments of the present disclosure.

Figure 5:
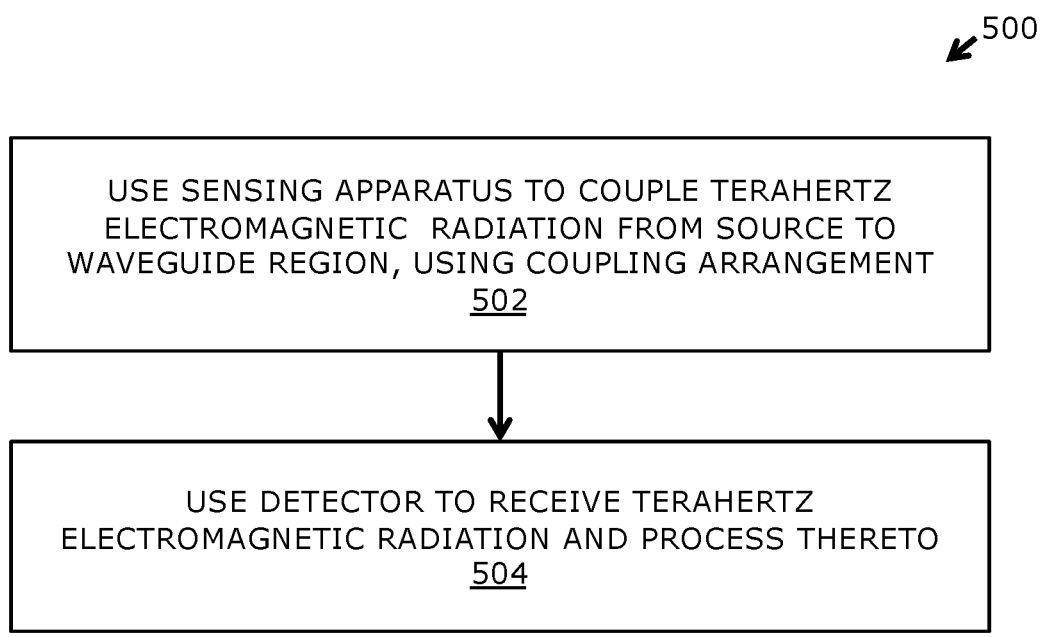
FIG. 5 illustrates steps of a method of sensing a structure of an electrode of an electrical battery, in accordance with an embodiment of the present disclosure.

Referring to FIG. 5, illustrated are steps of a method 500 of sensing a structure of an electrode of an electrical battery, in accordance with an embodiment of the present disclosure. In the method 500 of sensing a structure of an electrode of an electrical battery, the electrode is arranged to have one or more layers spatially adjacent thereto that provide a waveguide region that includes a surface of the electrode that changes in structure as a state-of-charge of the electrical battery changes. At a step 502, a sensing apparatus including a source of Terahertz electromagnetic radiation and a coupling arrangement to couple Terahertz electromagnetic radiation from the source into the waveguide region is used. Typically, the Terahertz electromagnetic radiation interacts with one or more features present at the surface of the electrode. At a step 504, a detector is used to receive Terahertz electromagnetic radiation that is reflected and/or transmitted through the waveguide region. Moreover, the detector is used to process the Terahertz electromagnetic radiation that is reflected and/or transmitted through the waveguide region, to determine temporal changes therein that are indicative of one or more dendritic growths occurring at the surface of the electrode.

The steps 502 and 504 are only illustrative and other alternatives can also be provided where one or more steps are added, one or more steps are removed, or one or more steps are provided in a different sequence without departing from the scope of the claims herein.

Modifications to embodiments of the present disclosure described in the foregoing are possible without departing from the scope of the present disclosure as defined by the accompanying claims. Expressions such as "including", "comprising", "incorporating", "have", "is" used to describe and claim the present disclosure are intended to be construed in a non-exclusive manner, namely allowing for items, components or elements not explicitly described also to be present. Reference to the singular is also to be construed to relate to the plural.

The invention claimed is:

1. A sensing apparatus for determining temporal change in a structure of an electrode of an electrical battery connected to a source of Terahertz electromagnetic radiation, wherein the sensing apparatus comprises:
 layers of electrode arranged spatially adjacent thereto to provide a waveguide region including a surface of the layers that changes in structure as a state-of-charge of the electrical battery changes;
 a separator between layers of the electrodes, configured to allow for flow of ions therethrough;
 current collectors configured to ensure uniform distribution of electric charge in the layers of electrodes; and
 a detector configured to receive Terahertz electromagnetic radiation that is reflected and/or transmitted through the waveguide region, and processes the Terahertz electromagnetic radiation that is reflected and/or transmitted to determine temporal changes therein based on decrease in power of the received Terahertz electromagnetic radiation,
 wherein the source further comprises a coupling arrangement configured to couple Terahertz electromagnetic radiation from the source into the waveguide region, whereat the Terahertz electromagnetic radiation interacts with one or more features present at a surface of the electrode wherein the source is configured to generate, when in operation, the Terahertz electromagnetic radiation as pulsed radiation, and the detector is configured to determine temporal signatures of the pulsed radiation that is reflected and/or transmitted to determine temporal changes therein that are indicative of one or more dendritic growths occurring at the surface of the electrode.

2. The sensing apparatus of claim 1, wherein the source generates the Terahertz electromagnetic radiation having a frequency in a range of 0.1 Terahertz (THz) to 30 Terahertz (THz).

3. The sensing apparatus of claim 1, wherein the coupling arrangement configured to alter an incident angle of the Terahertz electromagnetic radiation from the source, for coupling thereto into the waveguide region.

4. The sensing apparatus of claim 1, wherein the waveguide region, provided by the one or more layers of the electrode, has a minimum spatial extent in a range of 225 micro-metres (μm) to 300 micro-metres (μm).

5. The sensing apparatus of claim 1, wherein the sensing apparatus further includes a collimating lens to direct the Terahertz electromagnetic radiation that is reflected and/or transmitted through the waveguide region to the detector.

6. The sensing apparatus of claim 1, wherein the waveguide region further comprises at least one of: air, a dielectric medium.

7. The sensing apparatus of claim 1, wherein the electrode the electrical battery is composed using at least one of: a metal, a metal compound, a hydrogen compound, a carbon compound.

8. The sensing apparatus of claim 1, wherein the sensing apparatus comprises a pouch cell and optical windows, wherein the pouch cell forms an outer casing for the electrical battery.

9. A method for determining temporal change in a structure of an electrode of an electrical battery connected to a source of Terahertz electromagnetic radiation, wherein the method comprises:
 arranging layers of electrode spatially adjacent thereto to provide a waveguide region including a surface of the layers that changes in structure as a state-of-charge of the electrical battery changes;
 using a separator between layers of the electrodes, to allow for flow of ions therethrough;
 using current collectors to ensure uniform distribution of electric charge in the layers of electrodes; and
 using a detector to receive Terahertz electromagnetic radiation that is reflected and/or transmitted through the waveguide region, and to process the Terahertz electromagnetic radiation that is reflected and/or transmitted to determine temporal changes therein based on decrease in power of the received Terahertz electromagnetic radiation;
 wherein the source further comprises a coupling arrangement to couple Terahertz electromagnetic radiation from the source into the waveguide region, whereat the Terahertz electromagnetic radiation interacts with one or more features present at a surface of the electrode and wherein the method includes generating the Terahertz electromagnetic radiation as pulsed radiation, and receiving the pulsed radiation that is reflected and/or transmitted through the waveguide region to determine temporal signatures of the pulsed radiation that is reflected and/or transmitted, to determine temporal changes therein that are indicative of one or more dendritic growths occurring at the surface of the electrode (108).

10. The method of claim 9, wherein the method includes generating the Terahertz electromagnetic radiation having a frequency in a range of 0.1 Terahertz (THz) to 30 Terahertz (THz).

11. The method of claim 9, wherein the method includes altering an incident angle of the Terahertz electromagnetic radiation from the source, for coupling thereto into the waveguide region.

12. The method of claim 9, wherein the waveguide region, provided by the one or more layers of the electrode, has a minimum spatial extent in a range of 225 micro-metres (μm) to 300 micro-metres (μm).

13. The method of claim 9, wherein the method further includes employing a collimating lens to direct the Terahertz electromagnetic radiation that is reflected and/or transmitted through the waveguide region to the detector.

14. The method of claim 9, wherein the waveguide region further comprises any one of: air, a dielectric medium.

15. The method of claim 9, wherein the electrode of the electrical battery is composed using at least one of: a metal, a metal compound, a hydrogen compound, a carbon compound.

16. The method of claim 9, wherein the sensing apparatus comprises a pouch cell and optical windows, wherein the pouch cell forms an outer casing for the electrical battery.

\* \* \* \* \*